US011190177B2

(12) United States Patent
Zhang et al.

(10) Patent No.: US 11,190,177 B2
(45) Date of Patent: Nov. 30, 2021

(54) DIODE WITH LOW THRESHOLD VOLTAGE AND HIGH BREAKDOWN VOLTAGE

(71) Applicant: Shenzhen Goodix Technology Co., Ltd., Shenzhen (CN)

(72) Inventors: Mengwen Zhang, San Diego, CA (US); Hassan Elwan, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 270 days.

(21) Appl. No.: 16/282,264

(22) Filed: Feb. 21, 2019

(65) Prior Publication Data

US 2020/0274529 A1 Aug. 27, 2020

(51) Int. Cl.
*H03K 17/10* (2006.01)
*H03K 17/00* (2006.01)
*H03K 17/0812* (2006.01)

(52) U.S. Cl.
CPC ......... *H03K 17/102* (2013.01); *H03K 17/002* (2013.01); *H03K 17/08122* (2013.01)

(58) Field of Classification Search
CPC ..... H02H 7/20; H01L 27/088; H01L 27/0814; H01L 27/0727; H01L 23/5256; H03K 17/102; H03K 17/002; H03K 17/08122; H03K 17/74; H03K 17/6871; H03M 1/12; H03M 1/08; H03M 5/293; H03M 2005/2932; G05F 3/24; G05F 1/56; G05F 1/569; G05F 1/59

(Continued)

(56) References Cited

U.S. PATENT DOCUMENTS 3,404,293 A * 10/1968 Harris .................. H02M 1/088
                                                           327/471
3,444,398 A *  5/1969 Brockway ............. H03K 17/73
                                                           327/443

(Continued)

FOREIGN PATENT DOCUMENTS

CN      102386911 A     3/2012
CN      103840821 A     6/2014

(Continued)

OTHER PUBLICATIONS

International Search Report dated Nov. 27, 2019 in the corresponding international application (application No. PCT/CN2019/104119).

*Primary Examiner* — Thienvu V Tran
*Assistant Examiner* — Nusrat Quddus
(74) *Attorney, Agent, or Firm* — Kilpatrick Townsend & Stockton LLP (57) ABSTRACT

Techniques are described for implementing diodes with low threshold voltages and high breakdown voltages. Some embodiments further implement diode devices with programmable threshold voltages. For example, embodiments can couples a native device with one or more low-threshold, diode-connected devices. The coupling is such that the low-threshold device provides a low threshold voltage while being protected from breakdown by the native device, effectively manifesting as a high breakdown voltage. Some implementations include selectable branches by which the native device is programmably coupled with any of multiple low-threshold, diode-connected devices.

19 Claims, 4 Drawing Sheets

(58) Field of Classification Search
USPC .............. 323/265–277, 314, 315; 361/91.5
See application file for complete search history.

(56) References Cited

U.S. PATENT DOCUMENTS

| | | | | |
|---|---|---|---|---|
| 3,941,940 | A * | 3/1976 | Ahmed | H04Q 3/521 |
| | | | | 327/384 |
| 4,158,866 | A * | 6/1979 | Baker | H03K 17/0826 |
| | | | | 361/86 |
| 4,374,303 | A * | 2/1983 | Stewart | H04M 19/06 |
| | | | | 320/137 |
| 4,380,687 | A * | 4/1983 | Stewart | H04M 19/08 |
| | | | | 320/DIG. 13 |
| 4,419,586 | A * | 12/1983 | Phipps | H03K 17/785 |
| | | | | 250/551 |
| 6,362,663 | B1 * | 3/2002 | Criscione | H03K 5/08 |
| | | | | 327/74 |
| 9,397,682 | B2 * | 7/2016 | Dinc | H03K 19/018585 |
| 2007/0279031 | A1 * | 12/2007 | Takeyama | G05F 1/465 |
| | | | | 323/314 |
| 2008/0061843 | A1 * | 3/2008 | Yanci | H03K 5/1252 |
| | | | | 327/78 |
| 2008/0180869 | A1 * | 7/2008 | Sugahara | H01L 27/0262 |
| | | | | 361/91.5 |
| 2008/0284383 | A1 * | 11/2008 | Aas | H02J 7/0031 |
| | | | | 320/164 |
| 2009/0189191 | A1 | 7/2009 | Sato et al. | |
| 2010/0277847 | A1 * | 11/2010 | Li | H02H 3/087 |
| | | | | 361/111 |
| 2011/0050198 | A1 * | 3/2011 | Dong | G05F 3/242 |
| | | | | 323/315 |
| 2013/0341641 | A1 | 12/2013 | Nishiwaki et al. | |
| 2014/0016361 | A1 * | 1/2014 | Weis | H02M 7/25 |
| | | | | 363/21.02 |
| 2014/0022683 | A1 * | 1/2014 | Brasola | H02H 9/041 |
| | | | | 361/91.2 |
| 2014/0085760 | A1 * | 3/2014 | Lui | H01L 27/0255 |
| | | | | 361/91.5 |
| 2014/0145208 | A1 * | 5/2014 | Rose | H03K 17/567 |
| | | | | 257/77 |
| 2014/0145781 | A1 * | 5/2014 | Taylor | H03K 17/6874 |
| | | | | 327/427 |
| 2014/0340139 | A1 | 11/2014 | Hirler et al. | |
| 2015/0043118 | A1 * | 2/2015 | Yajima | H02H 9/04 |
| | | | | 361/91.5 |
| 2015/0309526 | A1 * | 10/2015 | Dinc | H03M 1/167 |
| | | | | 341/155 |
| 2017/0179943 | A1 * | 6/2017 | Terenzi | H03K 5/08 |
| 2017/0358923 | A1 * | 12/2017 | Booth | H02M 1/083 |
| 2019/0267482 | A1 * | 8/2019 | Udrea | H01L 27/0605 |
| 2019/0296737 | A1 * | 9/2019 | Whitworth | H03K 17/302 |

FOREIGN PATENT DOCUMENTS

| | | |
|---|---|---|
| CN | 105007078 A | 10/2015 |
| CN | 107707235 A | 2/2018 |
| JP | 2013219306 A | 10/2013 |
| WO | 2013153937 A1 | 10/2013 |

* cited by examiner

DIODE WITH LOW THRESHOLD VOLTAGE AND HIGH BREAKDOWN VOLTAGE

FIELD OF THE INVENTION

The present invention relates generally to diode circuits. More particularly, embodiments of the present invention relate to diodes with low threshold voltages and high breakdown voltages, including diodes with programmable threshold voltages.

BACKGROUND OF THE INVENTION

Many electronic circuits use diode devices. Typically, a semiconductor diode is a type of electronic component having two terminals separated by a so-called "PN junction." Diodes are often used to permit current flow in a forward direction, while restricting current flow in a reverse direction, such as to act as a rectifier. Because of certain physical characteristics of the PN junction, each diode can have a threshold voltage and a breakdown voltage. The threshold voltage can define a magnitude of forward voltage, in excess of which the diode conducts in the forward direction. The breakdown voltage can define a magnitude of reverse voltage, below which the diode restricts current flow in the reverse direction, and above which the diode breaks down and conducts in the reverse direction.

Typically, devices having lower threshold voltages tend also to have lower breakdown voltages when implemented as diodes, and devices having higher threshold voltages tend to have higher breakdown voltages when implemented as diodes. In many electronics applications, it is desirable to have a low threshold voltage, but also to have a high breakdown voltage. For example, it is common for a conventional silicon diode to have a threshold voltage of 0.7 volts. In some charge pump applications, however, it is desirable for the charge pump to turn on (to begin conducting in a forward direction) at voltage levels below 0.7 volts. However, replacing the conventional silicon diode in such a circuit with a diode having a lower threshold voltage can result in the circuit operation now being limited by a lower breakdown voltage of the replacement diode.

BRIEF SUMMARY OF THE INVENTION

Embodiments include circuits, devices, applications, and methods for diodes with low threshold voltages and high breakdown voltages. Some embodiments further include diode devices with programmable threshold voltages. For example, embodiments can couples a native device with one or more low-threshold, diode-connected devices. The coupling is such that the low-threshold device provides a low threshold voltage while being protected from breakdown by the native device, effectively manifesting as a high breakdown voltage. Some implementations include selectable branches by which the native device is programmably coupled with any of multiple low-threshold, diode-connected devices.

According to one set of embodiments, a programmable-threshold diode device is provided. The device includes: a cathode terminal; an anode terminal; a protection device; and a low-threshold-voltage diode bank. The protection device has a protection control input coupled with the anode terminal, such that application at the anode terminal of a voltage level exceeding a protection threshold voltage level permits current to flow through the protection device, the protection threshold voltage level being non-positive (e.g., zero or negative). The low-threshold-voltage diode bank includes a plurality of parallel paths, each parallel path having: a switch of a plurality of switches; and a low-threshold-voltage device of a plurality of low-threshold-voltage devices, each low-threshold-voltage device having a respective threshold voltage that is different from that of at least some others of the plurality of low-threshold-voltage devices, the low-threshold-voltage device coupled between the anode terminal and the switch, and having a diode control input coupled with the anode terminal, such that application at the anode terminal of a voltage level exceeding the respective threshold voltage permits current to flow through the low-threshold-voltage device. Closing any switch couples a corresponding one of the low-threshold-voltage devices to the protection device.

According to another set of embodiments, low-threshold-voltage, high-breakdown-voltage (LTHB) diode device is provided. The device includes: a cathode terminal; an anode terminal; a protection device having a protection control input coupled with the anode terminal, the protection device having a non-positive threshold voltage; and a low-threshold-voltage diode having a positive threshold voltage, the low-threshold-voltage diode coupled between the anode terminal and the protection device, such that application at the anode terminal of a voltage level exceeding the positive threshold voltage permits current to flow from the anode terminal to the cathode terminal through the low-threshold-voltage diode and the protection device, and application at the anode terminal of a voltage level below the positive threshold voltage inhibits current from flowing from the anode terminal to the cathode terminal.

According to another set of embodiments, a method is provided for programming a threshold voltage of a diode device. The method includes: first enabling, at a first time, a first switch of a plurality of switches, each of the plurality of switches configured to selectively enable one of a plurality of parallel branches, wherein each parallel branch comprising a low-threshold-voltage diode of a plurality of low-threshold-voltage diodes, and wherein the first enabling couples a first of the plurality of low-threshold-voltage diodes to a protection device, the first of the plurality of low-threshold-voltage diodes having a first positive threshold voltage, and the protection device having a non-positive threshold voltage; and second enabling, at a second time, a second switch of the plurality of switches, wherein the second enabling coupling a second of the plurality of low-threshold-voltage diodes to the protection device, the second of the plurality of low-threshold-voltage diodes having a second positive threshold voltage that is different from the first positive threshold voltage.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
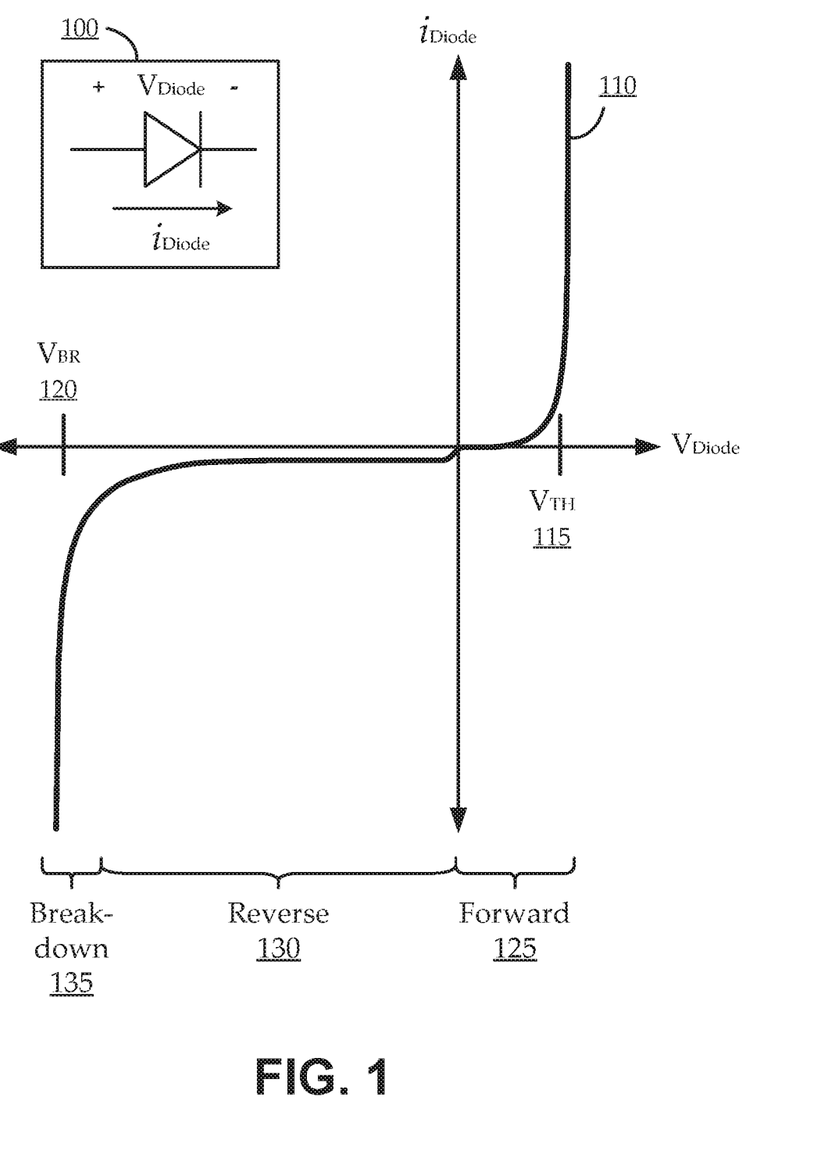
FIG. 1 shows an illustrative conventional diode and an illustrative current versus voltage (IV) plot for the diode, as a context for discussing certain features of embodiments.

For the sake of context, FIG. 1 shows an illustrative conventional diode 100 and an illustrative current versus voltage (IV) plot 110 for the diode 100. The conventional diode 100 can be a conventional silicon diode, germanium diode, or other semiconductor diode. Such diodes 100 typically have a positive terminal (anode) and a negative terminal (cathode) separated by a so-called "PN junction." Using the illustrated convention, when a positive voltage ($V_{DIODE}$) is applied to the anode relative to the cathode, the diode 100 is forward biased, and a current ($i_{DIODE}$) can flow in the direction of the arrow. This forward direction operation is illustrated on the plot 110 as the forward region 125. In the forward region 125, as illustrated, the current flow through the diode 100 is substantially zero, until the voltage reaches a threshold voltage level (labeled $V_{TH}$ 115). With the diode voltage at or above the threshold voltage 115, the potential barrier between the "P" and "N" sides of the PN junction is effectively canceled, such that the diode conducts current in the forward direction. For example, above the threshold voltage 115, the diode 100 can act substantially as a short circuit for forward current flow.

When a negative voltage ($V_{DIODE}$) is applied to the anode relative to the cathode, the diode 100 is reverse biased, and a current ($i_{DIODE}$) is impeded from flowing in the direction opposite the arrow. This reverse direction operation is illustrated on the plot 110 as the reverse region 130. In the reverse region 130, as illustrated, the current flow through the diode 100 is substantially zero (or just below zero), until the negative voltage reaches a breakdown voltage level (labeled $V_{BR}$ 120). As long as the negative diode voltage remains below the breakdown voltage 120, the potential barrier between the "P" and "N" sides of the PN junction blocks reverse current flow, and the diode can act substantially as an open circuit. However, when the negative diode voltage exceeds the breakdown voltage 120, the potential barrier between the "P" and "N" sides of the PN junction can break down, and reverse current can flow. This is indicated as the breakdown region 135. For example, past the breakdown voltage 120 (at a voltage level that is more negative than the breakdown voltage 120), the diode 100 can act substantially as a short circuit for reverse current flow. For some types of diodes, such a breakdown is permanent (i.e., the diode 100 can be destroyed by exceeding the breakdown voltage 120). For other types of diodes (e.g., Zener diodes), such a breakdown can be controlled to avoid damaging the diode.

Typically, devices having lower threshold voltages 115 tend also to have lower breakdown voltages 120 when implemented as diodes, and devices having higher threshold voltages 115 tend to have higher breakdown voltages 120 when implemented as diodes. As used herein, relative terms, such as "high" and "low," are intended to be construed relative to conventional values. For example, the threshold voltage 115 for a conventional silicon diode is typically around 0.7 volts; such that, in a present conventional context, a diode 100 with a threshold voltage 115 of lower than about 0.6 volts would presently be considered as a "low threshold voltage" device. Further, terms, such as "high," low," "greater than," "less than," "in excess of," and the like, are intended to be construed with respect to the operating region (e.g., forward region 125 versus reverse region 130 or breakdown region 135). For example, reaching a breakdown voltage 120 involves reverse biasing the diode 100 with a particular a magnitude of voltage potential; which can be considered as a "negative" diode voltage in a forward-biased frame of reference, or as a positive diode voltage in a reverse-biased frame of reference. As such, a diode 100 would be referred to herein as having a "large" or "high" breakdown voltage 120, if reaching that breakdown voltage 120 involves applying a large or high reverse-biased voltage potential across the diode 100; and reference herein to "exceeding" such a breakdown voltage 120 may involve applying an even larger reverse-biased voltage potential across the diode 100 (i.e., even though the resulting voltage is more negative, it is considered herein to be "exceeding," or "greater than" the threshold voltage in the frame of reference of reverse-biased operation).

In many electronics applications, it is desirable to have a low threshold voltage 115, but also to have a high breakdown voltage 120. For example, some circuits, such as charge pumps, or DC-to-DC (direct current to direct current) converters, can convert an input voltage or current level to a different voltage or current level. Such circuits can rely on a diode device to turn on (i.e., operate in the forward direction) at certain portions of a periodic cycle, and to turn off (i.e., to operate in the reverse direction) at other portions of the periodic cycle. When used in certain applications, performance can be improved if such circuits can turn on at voltage levels below that of a conventional diode (e.g., 0.7 volts). However, conventional diodes for such applications that have lower threshold voltages 115 also typically have lower breakdown voltages 120. As such, using such a conventional lower-threshold-voltage diode can result in the circuit operation being limited by the lower breakdown voltage 120.

Accordingly, embodiments described herein include implementations of diode devices having a low threshold voltage 115 and a high breakdown voltage 120. Some embodiments described herein further enable diode devices, for which the threshold voltage 115 can be programmed while maintaining a high breakdown voltage 120.

Figure 2:
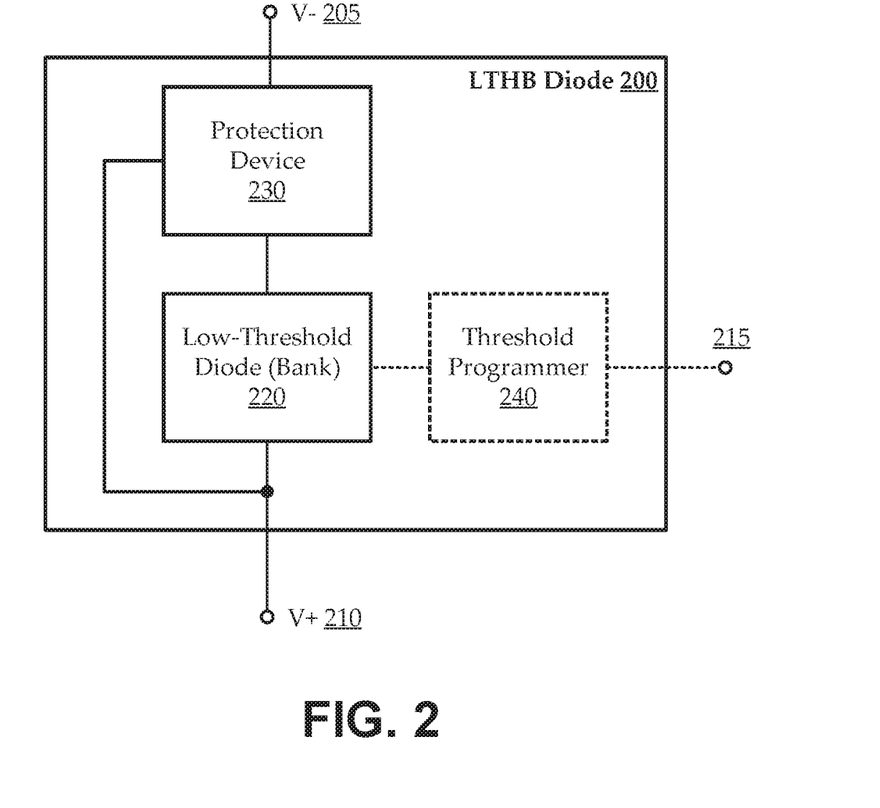
FIG. 2 shows a block diagram of an illustrative low threshold voltage, high breakdown voltage (LTHB) diode, according to various embodiments.

FIG. 2 shows a block diagram of an illustrative low threshold voltage, high breakdown voltage (LTHB) diode 200, according to various embodiments. As illustrated, the LTHB diode 200 can be implemented optionally as a two-terminal device, or as a three-terminal device. As a two terminal device, the LTHB diode 200 includes a low-threshold-voltage diode 220 coupled with a protection device 230, both coupled between a cathode 205 (e.g., a first terminal) and an anode 210 (e.g., a second terminal). The low-threshold-voltage diode 220 can be implemented as any suitable diode device having a threshold voltage that is appreciably lower than that of a typical conventional diode for the application in which the diode is being used (e.g., below 0.6 volts). For example, in applications that typically use thick-oxide devices (e.g., so-called "I/O devices"), the low-threshold-voltage diode 220 can be implemented using a think-oxide device, such as a diode-connected $eLV_T$ (extra-low threshold voltage) device, $LV_T$ (low threshold voltage) device, $aV_T$ (analog threshold voltage) device, or the like. In some cases, the low-threshold-voltage diode 220 can also be implemented using a $eHV_T$ (extra-high threshold voltage) device, or a $HV_T$ (high threshold voltage) device, if such device have threshold voltages below that of the conventional diode typically used for the particular application. The protection device 230 can be implemented as any suitable device that, when coupled with the low-threshold-voltage diode 220, provides breakdown voltage protection to the low-threshold-voltage diode 220 without increasing the effective threshold voltage. For example, so-called native devices, and/or other devices, can have substantially zero, or even negative, threshold voltages.

When implemented as a three-terminal device, the LTHB diode 200 includes multiple low-threshold-voltage diodes 220 (e.g., a low-threshold-voltage diode 220 bank) coupled with the protection device 230, both coupled between the cathode 205 (e.g., a first terminal) and the anode 210 (e.g., a second terminal). Further, in such an implementation, the LTHB diode 200 includes a threshold programmer 240 coupled with the low-threshold-voltage diode 220 bank. The bank of low-threshold-voltage diodes 220 can include multiple low-threshold-voltage diodes 220, each having different characteristics, including different threshold voltages. The threshold programmer 240 can receive an input programming signal 215, and can selectively couple one or more of the low-threshold-voltage diodes 220 in the bank with the protection device 230 responsive to the signal 215.

Figure 3:
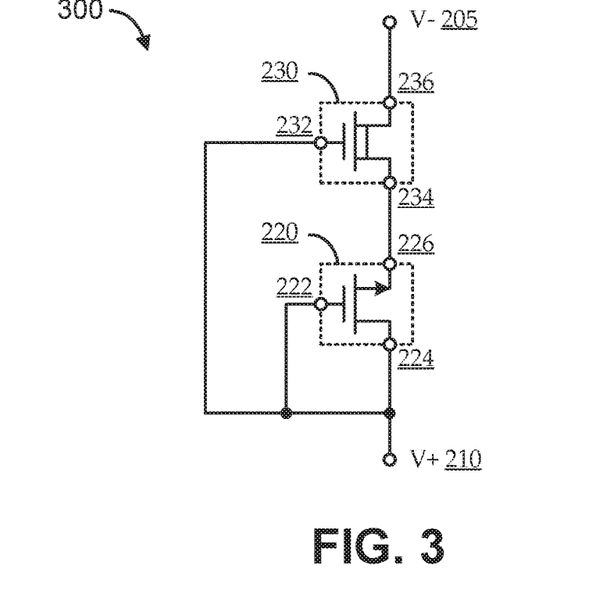
FIG. 3 shows a circuit implementation of an illustrative low threshold voltage, high breakdown voltage (LTHB) diode, according to various embodiments.

FIG. 3 shows a circuit implementation of an illustrative low threshold voltage, high breakdown voltage (LTHB) diode 300, according to various embodiments. The LTHB diode 300 can be an implementation of the two-terminal LTHB diode 200 embodiments described with reference to FIG. 2. As illustrated, the LTHB diode 300 can include a low-threshold-voltage diode 220 and a protection device 230, coupled between a cathode 205 and an anode 210. The low-threshold-voltage diode 220 can be implemented as a diode-connected transistor. For example, the low-threshold-voltage diode 220 is a metal-oxide semiconductor field-effect transistor (MOSFET) having a gate 222, a drain 224, and a source 226; where the drain 224 and the gate 222 coupled together. In such a configuration, the gate-to-source voltage of the transistor ($V_{GS}$) defines a threshold voltage above which the transistor acts like a diode with substantially quadratic current-versus-voltage (I-V) characteristics. For example, when a positive voltage is applied at the anode 210 (relative to the cathode 205) that overcomes the effective threshold voltage (due to the $V_{GS}$), the transistor turns on, and current is permitted to flow through the device; when a voltage is applied at the anode 210 (relative to the cathode 205) that is below the effective threshold voltage, the transistor turns off, and current is not permitted to flow.

Some embodiments of the protection device 230 are implemented as a depletion-mode transistor. Depletion-mode transistors can have a substantially zero, or even negative, threshold voltage. For example, the depletion-mode transistor can include a low-level P-doped silicon substrate, rather than P-well doping, to form a MOSFET channel. In effect, when the gate voltage is at zero, a conductive channel forms beneath the gate oxide layer, thereby effectively being normally on (i.e., any negative voltage, or a negative voltage exceeding a negative threshold level in some implementations, is needed to turn off the transistor). Some embodiments of the protection device 230 are implemented as a native (or "natural") transistor. In some instances, the native transistor is an implementation of a depletion-mode transistor. In other instances, the native transistor is a variety of MOSFET operating in an intermediate mode between a depletion-mode and an enhancement-mode transistor. In such instances, the native transistor typically manifests a threshold voltage at, or close to, zero volts.

As illustrated, the LTHB diode 300 can be implemented by coupling the drain 224 and the gate 222 of the low-threshold-voltage diode 220 (implemented as the diode-connected, enhancement-mode MOSFET) to the anode 210; and coupling the source 226 of the low-threshold-voltage diode 220 to a drain 234 of the protection device 230 (implemented as the depletion-mode or native transistor). A gate 232 of the protection device 230 is coupled to the anode 210, such that the protection device 230 also permits current to flow at least while the low-threshold-voltage diode 220 is conducting in the forward direction. A source 236 of the protection device 230 is coupled to the cathode 205.

Figure 4:
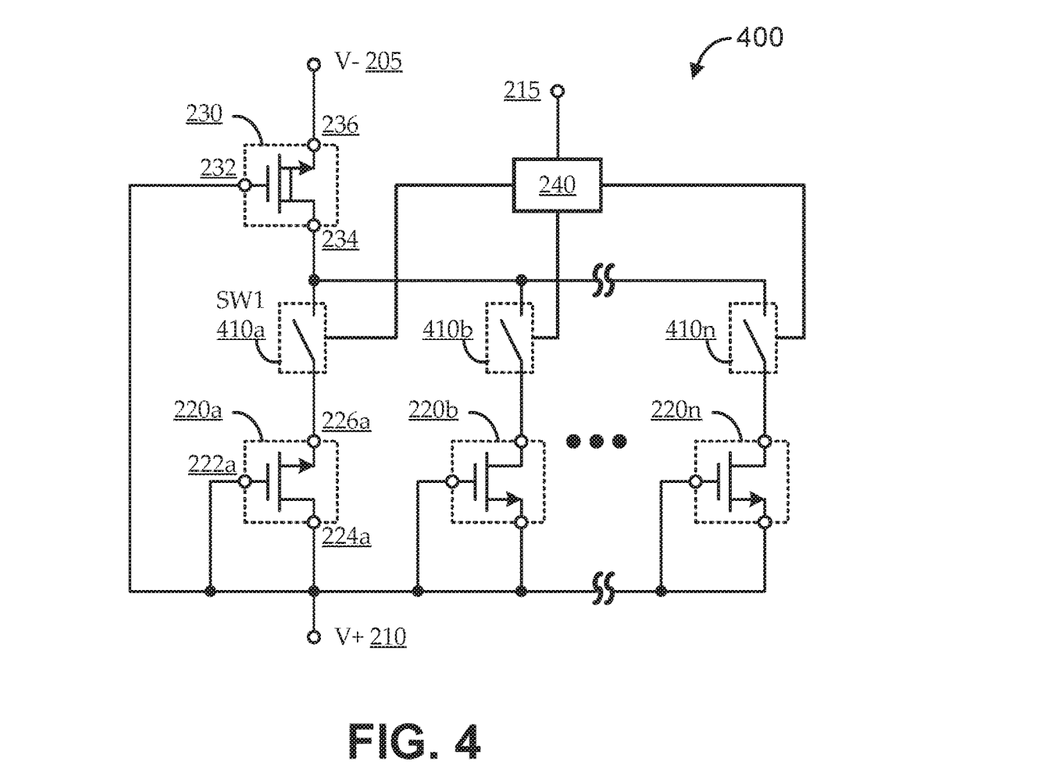
FIG. 4 shows a circuit implementation of an illustrative programmable-threshold diode, according to various embodiments.

FIG. 4 shows a circuit implementation of an illustrative programmable-threshold diode 400, according to various embodiments. The programmable-threshold diode 400 can be an implementation of the three-terminal LTHB diode 200 embodiments described with reference to FIG. 2. As illustrated, the programmable-threshold diode 400 can include multiple low-threshold-voltage diodes 220 (illustrated as low-threshold-voltage diodes 220a . . . 220n) and a protection device 230, coupled between a cathode 205 and an anode 210. Each low-threshold-voltage diode 220 can be coupled with the protection device 230 via a parallel branch, and each branch can include a switch 410 (illustrated as switches 410a . . . 410n). Each switch 410 can be implemented in any suitable manner, for example, as a MOS transistor. Closing the switch 410 for any particular branch couples the low-threshold-voltage diode 220 in that branch with the protection device 230. In some implementations, only a single switch 410 can be closed at any time. For example, at any particular time, the effective circuit acts like the LTHB diode 300 of FIG. 3 (i.e., the other branches of the programmable-threshold diode 400 are open circuits and are effectively not operating as part of the circuit at that time). In other implementations, multiple switches 410 can be closed, such that multiple low-threshold-voltage diodes 220 are coupled with the protection device 230 in parallel.

In some embodiments, each low-threshold-voltage diode 220 has a different threshold voltage characteristic. For example, the various branches can include one or more of a diode-connected $eLV_T$ (extra-low threshold voltage) device, $LV_T$ (low threshold voltage) device, $aV_T$ (analog threshold voltage) device, etc. Though each branch is shown as having only a single device implementing the low-threshold-voltage diode 220 for the branch, some embodiments can include multiple devices in each of one or more of the branches. For example, the low-threshold-voltage diode 220 of a particular branch can be implemented by multiple diode-connected, low-threshold-voltage transistors in series and/or parallel. Further, embodiments can be designed to permit other types of devices to be switched in to provide additional features. For example, the branches can also include a $eHV_T$ (extra-high threshold voltage) device, a $HV_T$ (high threshold voltage) device, a light-emitting diode device, a short circuit (i.e., such that the circuit operates only as the protection device 230 when the switch 410 of the corresponding branch is closed), etc. Accordingly, by controlling the switches 410 and selecting one or more branches, the threshold voltage (e.g., and possibly other characteristics) of the programmable-threshold diode 400 can be programmed.

The switches 410 can be controlled in any suitable manner. As illustrated, embodiments can include a threshold programmer 240 that controls the switches 410 responsive to an input programming signal 215. In some embodiments, the threshold programmer 240 can be implemented as a demultiplexer, or the like, with the input programming signal 215 used as a digital selector. For example, the input programming signal 215 (i.e., one or more bits) can effectively couple an input voltage level with a selected one of multiple outputs, and each output can be coupled with a respective one or more of the switches 410. In other embodiments, the programmable-threshold diode 400 is implemented as an integrated circuit having a housing with external interface structures (e.g., a set of pins, a ball grid array, etc.); and the switches 410 are coupled with one or more of the external interface structures. In such an implementation, the threshold programmer 240 can be used to assert a signal at a particular external interface structure (e.g., by applying a particular voltage level), causes one or more switches 410 to turn on or off. For example, the input programming signal 215 received by the threshold programmer 240 can be implemented as a plurality of signals (e.g., the single signal path represents a bus, or a set of signals), each coupled with an external interface structure (and corresponding to a respective one or more of the switches 410. In other embodiments, the threshold programmer 240 can be implemented as a dip switch, or other external mechanical switch, coupled with the programmable-threshold diode 400. For example, mechanically setting the threshold programmer 240 can effectively program the threshold voltage of the programmable-threshold diode 400. In some such implementations, the programming can be manual, and there may not be an input programming signal 215.

Figure 5:
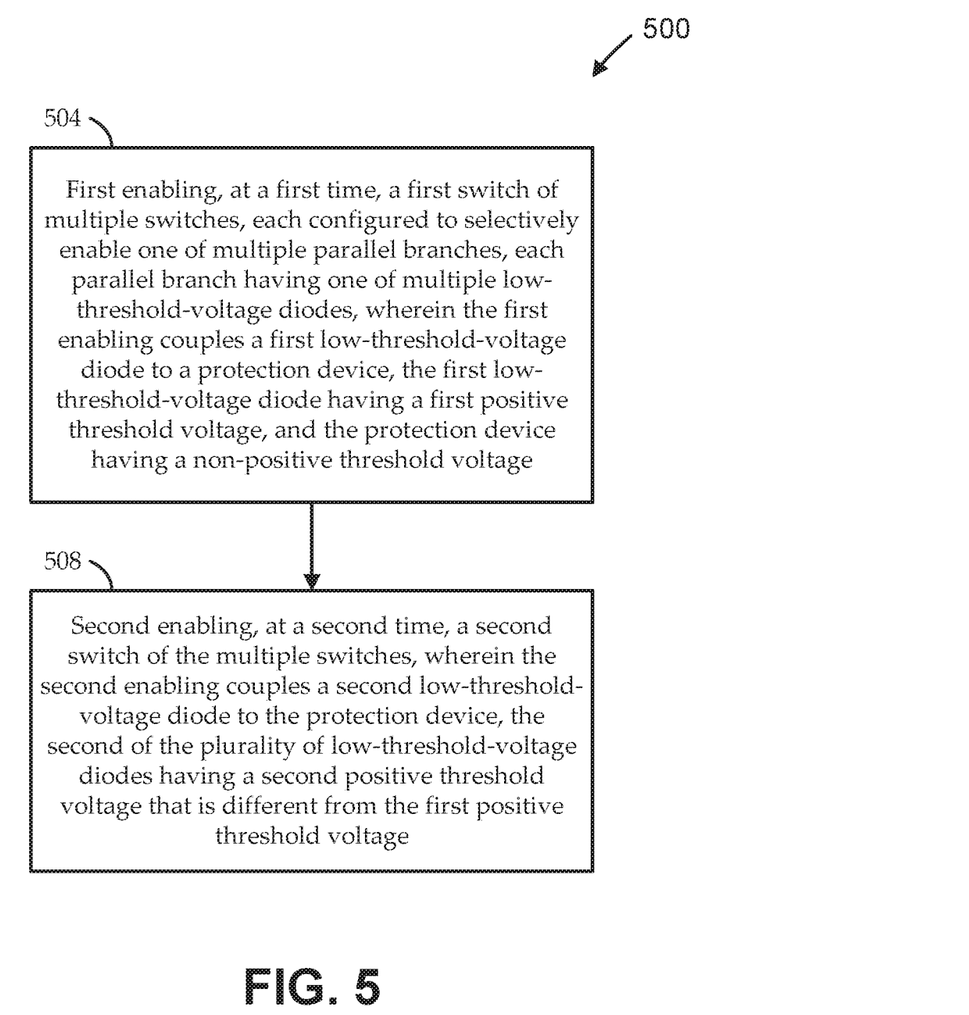
FIG. 5 shows a flow diagram of an illustrative method for programming a threshold voltage of a diode device, according to various embodiments.

FIG. 5 shows a flow diagram of an illustrative method 500 for programming a threshold voltage of a diode device, according to various embodiments. Embodiments of the method 500 begin at stage 504 by first enabling, at a first time, a first switch of multiple switches. Each switch is configured to selectively enable one of multiple parallel branches, each having one of multiple low-threshold-voltage diodes. The first enabling at stage 504 couples a first of the low-threshold-voltage diodes to a protection device. The first of the low-threshold-voltage diodes has a first positive threshold voltage (e.g., 0.3 volts), and the protection device has a non-positive threshold voltage (e.g., 0 volts, or −0.1 volts). At stage 508, embodiments can second enable, at a second time, a second of the switches. The second enabling couples a second of the low-threshold-voltage diodes to the protection device. The second of the low-threshold-voltage diodes has a second positive threshold voltage that is different from the first positive threshold voltage.

In some embodiments, the first enabling at stage 504 involves applying a first input programming signal at a signal input of a threshold programmer at the first time. The threshold programmer can have multiple switch outputs each to enable a corresponding one of the switches responsive to the signal input, such that applying the first input programming signal enables the first switch. In such embodiments, the second enabling at stage 508 can involve applying a second input programming signal (different from the first input programming signal) at the signal input of a threshold programmer at the second time. The threshold programmer is configured, such that applying the second input programming signal enables the second switch.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them, It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A programmable-threshold diode device comprising:
a cathode terminal;
an anode terminal;
a protection device having a protection control input coupled with the anode terminal, such that application at the anode terminal of a voltage level exceeding a protection threshold voltage level permits current to flow through the protection device, the protection threshold voltage level being non-positive; and
a low-threshold-voltage diode bank comprising a plurality of parallel paths, each parallel path comprising:
a switch of a plurality of switches; and
a low-threshold-voltage device of a plurality of low-threshold-voltage devices, each low-threshold-voltage device having a respective threshold voltage that is different from that of at least some others of the plurality of low-threshold-voltage devices, the low-threshold-voltage device coupled between the anode terminal and the switch, and having a diode control input coupled with the anode terminal, such that application at the anode terminal of a voltage level exceeding the respective threshold voltage permits current to flow through the low-threshold-voltage device,
wherein closing the switch couples the low-threshold-voltage device to the protection device, such that each of the plurality of parallel paths are selectively couplable to the protection device via the plurality of switches.

2. The programmable-threshold diode device of claim 1, further comprising:
a threshold programmer having a signal input and a plurality of switch outputs, the signal input to receive an input programming signal, and the plurality of switch outputs coupled with the plurality of switches, so as to control state of the plurality of switches responsive to the input programming signal.

3. The programmable-threshold diode device of claim 2, wherein:
the threshold programmer is a de-multiplexer having a switch control input to receive a switch assertion signal; and
the de-multiplexer is to couple the switch control input with one of the plurality of switch outputs in accordance with the input programming signal, such that a selected one of the plurality of switches is asserted by the switch assertion signal in accordance with the input programming signal.

4. The programmable-threshold diode device of claim 1, further comprising:
an integrated circuit housing having a plurality of interface structures integrated therewith, wherein:
the integrated circuit housing has, housed therein, the protection device and the low-threshold-voltage diode bank;
a first of the plurality of interface structures is coupled with the cathode terminal; and
a second of the plurality of interface structures is coupled with the anode terminal.

5. The programmable-threshold diode device of claim 4, wherein each of a set of the plurality of interface structures is coupled with a switch control of a respective one of the plurality of switches, such that a state of each of the plurality of switches is controllable in accordance with a signal applied at one of the set of the plurality of interface structures.

6. The programmable-threshold diode device of claim 4, further comprising:
a threshold programmer having a signal input and a plurality of switch outputs, the signal input to receive an input programming signal, and the plurality of switch outputs coupled with the plurality of switches, so as to control state of the plurality of switches responsive to the input programming signal,
wherein the signal input is coupled with at least one of the plurality of interface structures.

7. The programmable-threshold diode device of claim 1, wherein:
the respective threshold voltage of each low-threshold-voltage device is different from that of all others of the plurality of low-threshold-voltage devices.

8. The programmable-threshold diode device of claim 1, wherein:
the protection device is a depletion-mode transistor, the protection threshold voltage level being negative.

9. The programmable-threshold diode device of claim 1, wherein:
the protection device is a native transistor, the protection threshold voltage level being substantially zero.

10. The programmable-threshold diode device of claim 1, wherein:
the protection device is a non-enhancement mode, metal-oxide semiconductor transistor having a gate, a drain, and a source;
the gate is the protection control input coupled with the anode terminal;
the source is coupled to the cathode; and
the drain is coupled in parallel with the plurality of switches.

11. The programmable-threshold diode device of claim 1, wherein, for each parallel path:
the low-threshold-voltage device is a diode-connected, enhancement mode, metal-oxide semiconductor transistor having a gate, a drain, and a source;
the gate is the diode control input coupled with the anode terminal;
the drain is coupled to the anode terminal; and
the source is coupled with the in parallel with the switch.

12. A low-threshold-voltage, high-breakdown-voltage (LTHB) diode device comprising:
a cathode terminal;
an anode terminal;
a protection device having a protection control input coupled with the anode terminal, the protection device having a non-positive threshold voltage; and
a low-threshold-voltage diode having a positive threshold voltage, the low-threshold-voltage diode coupled between the anode terminal and the protection device,
such that application at the anode terminal of a voltage level exceeding the positive threshold voltage permits current to flow from the anode terminal to the cathode terminal through the low-threshold-voltage diode and the protection device, and
application at the anode terminal of a voltage level below the positive threshold voltage inhibits current from flowing from the anode terminal to the cathode terminal
the low-threshold-voltage diode comprising a plurality of low-threshold-voltage devices, each in a respective parallel path of a plurality of parallel paths, each respective parallel path selectively couplable to the protection device.

13. The LTHB diode device of claim 12, wherein:
the protection device is a non-enhancement-mode transistor having a first gate, a first source, and a first drain;
the low-threshold-voltage diode is an enhancement-mode transistor having a second gate, a second source, and a second drain;
the anode terminal is coupled with the first gate, the second gate, and the second drain;
the cathode terminal is coupled with the first source; and
the second source is coupled with the first drain.

14. The LTHB diode device of claim 12, wherein the non-positive threshold voltage of the protection device is a negative threshold voltage.

15. The LTHB diode device of claim 12, wherein the low-threshold-voltage diode is one of a diode-connected eLVT (extra-low threshold voltage) transistor device, a LVT (low threshold voltage) transistor device, or an aVT (analog threshold voltage) transistor device.

16. The LTHB diode device of claim 12, wherein each respective parallel path further comprises a respective switch of a plurality of switches, and further comprising:
a threshold programmer to receive an input programming signal and to control state of the plurality of switches responsive to the input programming signal.

17. The LTHB diode device of claim 12, wherein the low-threshold-voltage device in each in a respective parallel path has a respective threshold voltage, and each respective voltage is different from the respective voltages of all others of the plurality of low-threshold-voltage devices.

18. A method for programming a threshold voltage of a diode device, the method comprising:
first enabling, at a first time, a first switch of a plurality of switches, each of the plurality of switches configured to selectively enable one of a plurality of parallel branches,
wherein each parallel branch comprising a low-threshold-voltage diode of a plurality of low-threshold-voltage diodes, and
wherein the first enabling couples a first of the plurality of low-threshold-voltage diodes to a protection device, the first of the plurality of low-threshold-voltage diodes having a first positive threshold voltage, and the protection device having a non-positive threshold voltage; and
second enabling, at a second time, a second switch of the plurality of switches,
wherein the second enabling coupling a second of the plurality of low-threshold- voltage diodes to the protection device, the second of the plurality of low-threshold-voltage diodes having a second positive threshold voltage that is different from the first positive threshold voltage.

19. The method of claim 18, wherein:
the first enabling comprises applying a first input programming signal at a signal input of a threshold programmer at the first time;
the second enabling comprises applying a second input programming signal at the signal input of the threshold programmer at the second time; and
the threshold programmer has a plurality of switch outputs each to enable a corresponding one of the plurality of switches responsive to the signal input, such that applying the first input programming signal enables the first switch, and applying the second input programming signal enables the second switch.

* * * * *